United States Patent
Wojtczak et al.

(10) Patent No.: US 6,224,785 B1
(45) Date of Patent: May 1, 2001

(54) AQUEOUS AMMONIUM FLUORIDE AND AMINE CONTAINING COMPOSITIONS FOR CLEANING INORGANIC RESIDUES ON SEMICONDUCTOR SUBSTRATES

(75) Inventors: William A. Wojtczak; George Guan, both of San Jose, CA (US); Daniel N. Fine; Stephen A. Fine, both of Peabody, MA (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 08/924,021

(22) Filed: Aug. 29, 1997

(51) Int. Cl.[7] .................... C09K 13/00; C09K 13/06; C09K 13/08
(52) U.S. Cl. .................. 252/79.1; 252/79.2; 252/79.3; 252/79.4
(58) Field of Search .................. 252/79.1, 79.2, 252/79.3, 79.4; 438/689

(56) References Cited

U.S. PATENT DOCUMENTS

| | | |
|---|---|---|
| 4,087,367 | 5/1978 | Rioult et al. . |
| 4,569,722 | 2/1986 | Maury et al. . |
| 4,765,844 | 8/1988 | Merrem et al. . |
| 4,795,582 * | 1/1989 | Ohmi et al. .................. 252/79.3 |
| 4,871,422 * | 10/1989 | Scardera et al. .................. 156/662 |
| 4,921,572 | 5/1990 | Roche . |
| 5,091,103 | 2/1992 | Dean et al. . |
| 5,241,118 * | 8/1993 | Saxton et al. .................. 564/55 |
| 5,277,835 * | 1/1994 | Ohmi et al. .................. 252/79.3 |
| 5,308,745 | 5/1994 | Schwartzkopf . |
| 5,320,709 | 6/1994 | Bowden et al. . |
| 5,334,332 | 8/1994 | Lee . |
| 5,466,389 * | 11/1995 | Ilardi et al. .................. 252/156 |
| 5,571,447 | 11/1996 | Ward et al. . |
| 5,709,756 * | 1/1998 | Ward et al. .................. 134/1.3 |
| 5,780,406 * | 7/1998 | Honda et al. .................. 510/175 |
| 5,885,362 * | 3/1999 | Morinaga et al. .................. 134/2 |
| 5,989,353 * | 11/1999 | Skee et al. .................. 134/2 |

* cited by examiner

Primary Examiner—Jeffrie R. Lund
(74) Attorney, Agent, or Firm—Oliver A. M. Zitzmann; Robert O. Guillot

(57) ABSTRACT

A semiconductor wafer cleaning formulation for use in post plasma ashing semiconductor fabrication comprising the following components in the percentage by weight ranges shown:

| | |
|---|---|
| Ammonium fluoride and/or a derivative thereof; | 1–21% |
| an organic amine or mixture of two amines; | 20–55% |
| water; | 23–50% |
| a metal chelating agent or mixture of chelating agents. | 0–21% |

25 Claims, No Drawings

AQUEOUS AMMONIUM FLUORIDE AND AMINE CONTAINING COMPOSITIONS FOR CLEANING INORGANIC RESIDUES ON SEMICONDUCTOR SUBSTRATES

BACKGROUND OF THE INVENTION

1. Field of the Invention

The present invention relates generally to chemical formulations used in semiconductor wafer fabrication and particularly to chemical formulations that are utilized to remove residue from wafers following a resist plasma ashing step.

2. Description of the Prior Art

The prior art teaches the utilization of various chemical formulations to remove residue and clean wafers following a resist ashing step. Some of these prior art chemical formulations include akaline compositions containing amines and/or tetraalkyl ammonium hydroxides, water and/or other solvents, and chelating agents. Still other formulations are based on acidic to neutral solutions containing ammonium fluoride. The various prior art formulations have drawbacks which include unwanted removal of metal or insulator layers and the corrosion of desirable metal layers, particularly aluminum and aluminum-copper alloys and titanium nitride features. There is therefore a need for chemical formulations which effectively remove residue following a resist ashing step which do not attack and potentially degrade delicate structures which are meant to remain on a wafer.

SUMMARY OF THE INVENTION

A semiconductor wafer cleaning formulation for use in post plasma ashing semiconductor fabrication comprising the following components in the percentage by weight ranges shown:

| | |
|---|---|
| Ammonium fluoride and/or a derivative thereof; | 1–21% |
| an organic amine or mixture of two amines; | 20–55% |
| water; | 23–50% |
| a metal chelating agent or mixture of chelating agents. | 0–21% |

It is an advantage of the present invention that it effectively removes inorganic residues following a plasma ashing step.

It is another advantage of the present invention that it effectively removes metal halide and metal oxide residues following plasma ashing.

It is a further advantage of the present invention that it effectively removes slurry particles of aluminum oxides and other oxides remaining after CMP (chemical mechanical polishing).

It is yet another advantage of the present invention that it provides better stripping performance with less corrosivity than formulations containing ammonium fluoride without amines and amines without ammonium fluoride.

It is yet a further advantage of the present invention that it provides better stripping performance at lower processing temperatures than conventional amine-containing formulations.

It is still a further advantage of the present invention that it includes a chelating agent to prevent metal corrosion and increase stripping effectiveness.

These and other features and advantages of the present invention will become understood to those of ordinary skill in the art upon review of the following detailed description of the preferred embodiments.

DETAILED DESCRIPTION OF THE PREFERRED EMBODIMENTS

The present invention comprises formulations that are suitable for stripping inorganic wafer residues which originate from high density plasma etching followed by ashing with oxygen-containing plasmas. The formulations are also suitable for removing slurry particles of aluminum oxides and other oxides remaining after CMP (chemical mechanical polishing). The formulations contain ammonium fluoride or a derivative of ammonium fluoride, an amine or mixture of amines, water and, optionally, one or more metal chelating agents.

The preferred formulations utilize the following components (percentages are by weight):

| | |
|---|---|
| Ammonium fluoride and/or a derivative thereof: | 1–21% |
| An organic amine or mixture of two amines | 20–55% |
| Water | 23–50% |
| A Metal chelating agent or mixture of chelating agents: | 0–21% |

The Preferred Amines are:
  Diglycolamine (DGA)
  Methyldiethanolamine (MDEA)
  Pentamethyldiethylenetriamine (PMDETA)
  Triethanolamine (TEA)
  Triethylenediamine (TEDA)
Other Amines that are Effective Include:
  Hexamethylenetetramine
  3, 3-Iminobis (N,N-dimethylpropylamine)
  Monoethanolamine
The Preferred Fluoride Sources are:
  Ammonium fluoride
  Triethanolammonium fluoride (TEAF)
Other Fluoride Sources that are Effective Include:
  Diglycolammonium fluoride (DGAF)
  Tetramethylammonium fluoride (TMAF)
  Triethylamine tris (hydrogen fluoride) (TREAT-HF)
The Metal Chelating Agents that are Effective Include:
  Acetoacetamide
  Ammonium carbamate
  Ammonium pyrrolidinedithiocarbamate (APDC)
  Dimethyl malonate
  Methyl acetoacetate
  N-Methyl acetoacetamide
  2,4-Pentanedione
  Tetramethylammonium thiobenzoate
  Tetramethylammonium trifluoroacetate
  Tetramethylthiuram disulfide (TMTDS)

The combination of ammonium fluoride or a substituted fluoride source as identified above with an amine (other than as a surfactant in an amount of 1% or less) provides better stripping performance with less corrosivity than formulations containing ammonium fluoride without amines and formulations containing amines without ammonium fluoride. In addition, the resulting alkaline solutions were effective at lower processing temperatures (21°–40° C.) than conventional amine-containing formulations.

The use of 1,3-dicarbonyl compounds as chelating agents and to prevent metal corrosion also appears to increase effectiveness.

In the prior art amines are limited to 1% or less of the formulation and serve only as surfactants, or amines are not utilized as formulation ingredients at all. Also, the prior art formulations are acidic (pH<7). In the formulations of the present invention the amines are present as major components and play major roles in stripping, and the formulations are basic (pH>7).

Several representative examples of preferred formulations are:

| | |
|---|---|
| Triethanolamine | 45% |
| Ammonium fluoride | 5% |
| Water | 50% |
| Diglycolamine | 55% |
| Ammonium fluoride | 5% |
| 2,4-Pentanedione | 10% |
| Water | 30% |
| Triethanolamine | 27.1% |
| TEAF | 20.3% |
| 2,4-Pentanedione | 10% |
| Water | 42.6% |
| PMDETA | 45% |
| Ammonium fluoride | 5% |
| Methyl acetoacetate | 6% |
| Water | 44% |
| PMDETA | 45% |
| Ammonium fluoride | 1% |
| 2,4-Pentanedione | 8% |
| APDC | 15% |
| Water | 31% |
| PMDETA | 55% |
| Ammonium fluoride | 1% |
| Dimethyl malonate | 13.2% |
| TMTDS | 6% |
| Water | 24.8% |
| TEA | 36% |
| PMDETA | 16% |
| Ammonium fluoride | 12% |
| Acetoacetamide | 10% |
| Water | 28% |
| TEA | 45% |
| Ammonium fluoride | 11.4% |
| Tetramethylammonium-trifluoroacetate | 17% |
| Water | 27% |
| Triethanolamine | 45–52% |
| Ammonium fluoride | 3–10% |
| 2,4-Pentanedione | 5–10% |
| Water | 35–44% |
| PMDETA | 38–45% |
| Ammonium fluoride | 5% |
| 2,4-Pentanedione | 10% |
| Water | 40–47% |
| PMDETA | 38% |
| TMAF | 5% |
| Ammonium fluoride | 2% |
| 2,4-Pentanedione | 10% |
| Water | 45% |
| PMDETA | 38% |
| Ammonium fluoride | 1% |
| 2,4-Pentanedione | 10.7% |
| Ammonium carbamate | 10% |
| Water | 38.3% |

The inventors expect that closely related ingredients would be expected to show comparable performance to those utilized in our formulations.

These include:

A. Other organic amines are expected to be suitable.

B. Other substituted ammonium fluorides are expected to be suitable. These would have the general formula, $R_1R_2R_3R_4NF$ in which the R groups are Hydrogen atoms and/or aliphatic groups.

C. Other metal chelating agents including:
1. Other 1,3-dicarbonyl compounds are expected to display comparable performance. These would have the following general structure:

X-CHR-Y in which
R is either a Hydrogen atom or an aliphatic group and
X and Y are functional groups containing multiply bonded moities known to have electron-withdrawing properties, for example X and Y may be $CONH_2$, $CONHR'$, $CN$, $NO_2$, $SOR'$, $SO_2Z$ in which R' represents an alkyl group and Z represents another atom or group. X and Y may be identical or different.

2. Other amine trifluoroacetates are also expected to be suitable as chelating agents. These would have the general formula, $R_1R_2R_3R_4N^+\ ^-O_2CCF_3$ in which the R groups are Hydrogen atoms and/or aliphatic groups.

D. It would also be expected that inclusion of optional components such as surfactants, stabilizers, corrosion inhibitors, buffering agents, and cosolvents would constitute obvious additions to those practiced in the art.

The formulations of the present invention are particularly useful on wafers which have been etched with chlorine- or fluorine-containing plasmas followed by oxygen plasma ashing. The residues generated by this type of processing typically contain inorganic materials such as, but not limited to, aluminum oxide, titanium oxide and aluminum fluoride. These residues are often difficult to dissolve completely without causing corrosion of metal and titanium nitride features required for effective device performance. Also, metal oxide and silicon oxide slurry particles remaining after CMP will also be effectively removed by these formulations.

Three types of commercially generated wafers containing via structures were evaluated using the formulations of the present invention. In each case, following plasma etching and ashing, immersion of wafers in the formulation of the present invention was performed in baths at 21–60° C. for 10–30 minutes (preferred: 21–35° C. for 20–30 minutes) followed by washing with deionized water and drying with a stream of nitrogen gas. It is expected that the formulations can also be applied by spraying onto the wafers in an automated spray tool followed by a water rinse.

The three via structures were:
1. 0.8 micron diameter, four layer vias comprised of silicon oxide top and second layers, a third layer of titanium nitride, and a bottom layer of aluminum, silicon, copper (AlSiCu) alloy. The substrate was silicon oxide.
2. One micron diameter, two-layer vias comprised of a top layer of silicon oxide (7000 Angs. thick) and a bottom layer of titanium nitride (1200 Angs. thick) on top of a silicon substrate.
3. 1.6 micron wide, 4-layer vias with a top layer of titanium nitride (40 Nm. thick), a second layer of silicon oxide (1.3 microns thick), and a bottom layer of aluminum/copper on a silicon oxide substrate.

The present formulations were rated according to relative stripping effectiveness and corrosivity of the formulations. The preferred formulations scored best and, in overall performance based on both stripping effectiveness and low corrosivity, are approximately equal.

While the present invention has been described with reference to certain preferred embodiments, it will be understood by those skilled in the art that various alterations and modifications may be made therein without departing from the true spirit and scope of the invention. It is therefore intended that the following claims cover all such alterations and modifications which nevertheless include the true spirit and scope of the invention.

What we claim is:

1. A semiconductor wafer cleaning formulation for use in post plasma ashing semiconductor fabrication comprising the following components in the percentage by weight ranges shown:

| | |
|---|---|
| a fluoride source; | 1–21% |
| at least one organic amine; | 20–55% |
| water; | 23–50%. |

2. A cleaning formulation as described in claim 1 wherein said fluoride source is chosen from the group consisting of:
Ammonium fluoride; and
Triethanolammonium fluoride (TEAF).

3. A cleaning formulation as described in claim 1 wherein said organic amine is chose from the group consisting of:
Diglycolamine (DGA),
Methyldiethanolamine (MDEA),
Pentamethyldiethylenetriamine (PMDETA),
Triethanolamine (TEA), and
Triethylenediamine (TEDA).

4. A cleaning formulation as described in claim 1 wherein said fluoride source is chosen from the group consisting of:
Ammonium fluoride,
Triethanolammonium fluoride (TEAF),
Diglycolammonium fluoride (DGAF),
Tetramethylammonium fluoride (TMAF), and
Triethylamine tris (hydrogen fluoride) (TREAT-HF).

5. A cleaning formulation as described in claim 1 wherein said organic amine is chosen from the group consisting of:
Diglycolamine (DGA),
Methyldiethanolamine (MDEA),
Pentamethyldiethylenetriamine (PMDETA),
Triethanolamine (TEA),
Triethylenediamine (TEDA),
Hexamethylenetetramine,
3, 3-Iminobis (N,N-dimethylpropylamine), and
Monoethanolamine.

6. A cleaning formulation as described in claim 1 wherein said fluoride source is chosen from the group consisting of:
Ammonium fluoride,
Triethanolammonium fluoride (TEAF),
Diglycolammonium fluoride (DGAF),
Tetramethylammonium fluoride (TMAF), and
Triethylamine tris (hydrogen fluoride) (TREAT-HF);
and said organic amine is chosen from the group consisting of:
Diglycolamine (DGA),
Methyldiethanolamine (MDEA),
Pentamethyldiethylenetriamine (PMDETA),
Trietholamine (TEA),
Triethylenediamine (TEDA),
Hexamethylenetetramine,
3, 3-Iminobis (N,N-dimethylpropylamine), and
Monoethanolamine.

7. A cleaning formulation as described in claim 1 being comprised of:

| | |
|---|---|
| Triethanolamine | 45% |
| Ammonium fluoride | 5% |
| Water | 50%. |

8. A cleaning formulation as described in claim 1 wherein said fluoride source is chosen from the group consisting of:
Ammonium fluoride,
Triethanolammonium fluoride (TEAF),
Diglycolammonium fluoride (DGAF),
Tetramethylammonium fluoride (TMAF), and
Triethylamine tris (hydrogen fluoride) (TREAT-HF);
said organic amine is chosen from the group consisting of:
Diglycolamine (DGA),
Methyldiethanolamine (MDEA),
Pentamethyldiethylenetriamine (PMDETA),
Trietholamine (TEA),
Triethylenediamine (TEDA),
Hexamethylenetetramine,
3, 3-Iminobis (N,N-dimethylpropylamine), and
Monoethanolamine;
and said metal chelating agent is chosen from the group consisting of:
Acetoacetamide,
Ammonium carbamate,
Ammonium pyrrolidinedithiocarbamate (APDC),
Dimethyl malonate,
Methyl acetoacetate,
N-Methyl acetoacetamide,
2,4-Pentanedione,
Tetramethylammonium thiobenzoate,
Tetramethylammonium trifluoroacetate, and
Tetramethylthiuram disulfide (TMTDS).

9. A semiconductor wafer cleaning formulation for use in post plasma ashing semiconductor fabrication comprising the following components in the percentage by weight ranges shown:

| | |
|---|---|
| a fluoride source; | 1–21% |
| at least one organic amine; | 20–55% |
| water; | 23–50% |
| at least one metal chelating agent. | 1–21%. |

10. A cleaning formulation as described in claim 9 wherein said metal chelating agent is chosen from the group consisting of:
Acetoacetamide,
Ammonium carbamate,
Ammonium pyrrolidinedithicarbamate (APDC),
Dimethyl malonate,
Methyl acetoacetate,
N-Methyl acetoacetamide,
2,4-Pentanedione,
Tetramethylammonium thiobenzoate,
Tetramethylammonium trifluoroacetate, and
Tetramethylthiuram disulfide (TMTDS).

11. A cleaning formulation as described in claim 9 wherein said fluoride source has the general formula $R_1R_2R_3R_4NF$ in which the R groups are hydrogen atoms and/or aliphatic groups, and wherein said metal chelating agent would have the following general structure:

X-CHR-Y in which

R is either a hydrogen atom or an aliphatic group and

X and Y are functional groups containing multiply bonded moities known to have electron-withdrawing properties, wherein X and Y may be $CONH_2$, CONHR', CN, $NO_2$, SOR', $SO_2Z$ in which R' represents an alykl group and Z represents another atom or group, and wherein X and Y may be identical or different.

12. A cleaning formulation as described in claim 9 wherein said fluoride source has the general formula $R_1R_2R_3R_4NF$ in which the R groups are hydrogen atoms and/or aliphatic groups, and wherein said metal chelating agent would have the general formula, $R_1R_2R_3R_4N^+ \text{-}O_2CCF_3$ in which the R groups are hydrogen atoms and/or aliphatic groups.

13. A cleaning formulation as described in claim 9 being comprised of:

| | |
|---|---|
| Diglycolamine | 55% |
| Ammonium fluoride | 5% |
| 2,4-Pentanedione | 10% |
| Water | 30%. |

14. A cleaning formulation as described in claim 9 being comprised of:

| | |
|---|---|
| Triethanolamine | 27.1% |
| TEAF | 20.3% |
| 2,4-Pentanedione | 10% |
| Water | 42.6%. |

15. A cleaning formulation as described in claim 9 being comprised of:

| | |
|---|---|
| PMDETA | 45% |
| Ammonium fluoride | 5% |
| Methyl acetoacetate | 6% |
| Water | 44%. |

16. A cleaning formulation as described in claim 9 being comprised of:

| | |
|---|---|
| PMDETA | 45% |
| Ammonium fluoride | 1% |
| 2,4-Pentanedione | 8% |
| APDC | 15% |
| Water | 31%. |

17. A cleaning formulation as described in claim 9 being comprised of:

| | |
|---|---|
| PMDETA | 55% |
| Ammonium fluoride | 1% |
| Dimethyl malonate | 13.2% |
| TMTDS | 6% |
| Water | 24.8%. |

18. A cleaning formulation as described in claim 9 being comprised of:

| | |
|---|---|
| TEA | 36% |
| PMDETA | 16% |
| Ammonium fluoride | 12% |
| Acetoacetamide | 10% |
| Water | 28%. |

19. A cleaning formulation as described in claim 9 being comprised of:

| | |
|---|---|
| TEA | 45% |
| Ammonium fluoride | 11.4% |
| Tetramethylammonium-trifluoroacetate | 17% |
| Water | 27%. |

20. A cleaning formulation as described in claim 9 being comprised of:

| | |
|---|---|
| Triethanolamine | 45–52% |
| Ammonium fluoride | 3–10% |
| 2,4-Pentanedione | 5–10% |
| Water | 35–44%. |

21. A cleaning formulation as described in claim 9 being comprised of:

| | |
|---|---|
| PMDETA | 38–45% |
| Ammonium fluoride | 5% |
| 2,4-Pentanedione | 10% |
| Water | 40–47%. |

22. A cleaning formulation as described in claim 9 being comprised of:

| | |
|---|---|
| PMDETA | 38% |
| TMAF | 5% |
| Ammonium fluoride | 2% |
| 2,4-Pentanedione | 10% |
| Water | 45%. |

23. A cleaning formulation as described in claim 9 being comprised of:

| | |
|---|---|
| PMDETA | 38% |
| Ammonium fluoride | 1% |
| 2,4-Pentanedione | 10.7% |
| Ammonium carbamate | 10% |
| Water | 38.3%. |

24. A cleaning formulation as described in claim 9 wherein said fluoride source is chosen from the group consisting of:

Ammonium fluoride,
Triethanolammonium fluoride (TEAF),
Diglycolammonium fluoride (DGAF),
Tetramethylammonium fluoride (TMAF), and
Triethylamine tris (hydrogen fluoride) (TREAT-HF).

25. A cleaning formulation as described in claim 9 wherein said organic amine is chosen from the group consisting of:

Diglycolamine (DGA),
Methyldiethanolamine (MDEA),
Pentamethyldiethylenetriamine (PMDETA),
Trietholamine (TEA),
Triethylenediamine (TEDA),
Hexamethylenetetramine,
3, 3-Iminobis (N,N-dimethylpropylamine), and
Monoethanolamine.

* * * * *